US011598000B2

(12) United States Patent
Arnepalli et al.

(10) Patent No.: US 11,598,000 B2
(45) Date of Patent: Mar. 7, 2023

(54) METHOD, MATERIALS AND PROCESS FOR NATIVE OXIDE REMOVAL AND REGROWTH OF DIELECTRIC OXIDES FOR BETTER BIOSENSOR PERFORMANCE

(71) Applicant: Applied Materials, Inc., Santa Clara, CA (US)

(72) Inventors: Ranga Rao Arnepalli, Andhra Pradesh (IN); Colin Costano Neikirk, Sunnyvale, CA (US); Yuriy Melnik, San Jose, CA (US); Suresh Chand Seth, Bhandup West (IN); Pravin K. Narwankar, Sunnyvale, CA (US); Sukti Chatterjee, San Jose, CA (US); Lance A. Scudder, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/137,797

(22) Filed: Sep. 21, 2018

(65) Prior Publication Data

US 2019/0119810 A1    Apr. 25, 2019

(30) Foreign Application Priority Data

Sep. 26, 2017    (IN) .............................. 201741034078

(51) Int. Cl.
*C23C 14/02*    (2006.01)
*C23C 16/02*    (2006.01)
(Continued)

(52) U.S. Cl.
CPC .......... *C23C 16/02* (2013.01); *C23C 16/0236* (2013.01); *C23C 16/0245* (2013.01);
(Continued)

(58) Field of Classification Search
None
See application file for complete search history.

(56) References Cited

U.S. PATENT DOCUMENTS 5,563,762 A * 10/1996 Leung ............... H01L 21/76895
257/295
8,288,234 B2 * 10/2012 Seino .................. C23C 14/0641
257/E21.267
(Continued)

FOREIGN PATENT DOCUMENTS

CN    102144281 A    8/2011
JP    S6083373 A    5/1985
(Continued)

OTHER PUBLICATIONS

International Search Report and Written Opinion dated Jan. 25, 2019 for Application No. PCT/US2018/052127.
(Continued)

*Primary Examiner* — Mandy C Louie
(74) *Attorney, Agent, or Firm* — Patterson + Sheridan, LLP

(57) ABSTRACT

Methods of removing native oxide layers and depositing dielectric layers having a controlled number of active sites on MEMS devices for biological applications are disclosed. In one aspect, a method includes removing a native oxide layer from a surface of the substrate by exposing the substrate to one or more ligands in vapor phase to volatize the native oxide layer and then thermally desorbing or otherwise etching the volatized native oxide layer. In another aspect, a method includes depositing a dielectric layer selected to provide a controlled number of active sites on the surface of the substrate. In yet another aspect, a method includes both removing a native oxide layer from a surface of the substrate by exposing the substrate to one or (Continued)

more ligands and depositing a dielectric layer selected to provide a controlled number of active sites on the surface of the substrate.

16 Claims, 7 Drawing Sheets

(51) Int. Cl.
    *C23C 16/50*     (2006.01)
    *C23C 16/455*     (2006.01)
    *C23C 16/56*     (2006.01)
    *C23C 16/40*     (2006.01)

(52) U.S. Cl.
    CPC ...... *C23C 16/401* (2013.01); *C23C 16/45525* (2013.01); *C23C 16/45531* (2013.01); *C23C 16/45542* (2013.01); *C23C 16/50* (2013.01); *C23C 16/56* (2013.01)

(56) References Cited

U.S. PATENT DOCUMENTS

| | | | |
|---|---|---|---|
| 2003/0087523 A1 | 5/2003 | Sandhu et al. | |
| 2004/0168627 A1* | 9/2004 | Conley, Jr. | C30B 25/02 117/89 |
| 2004/0197227 A1* | 10/2004 | Hauan | G01N 29/036 422/68.1 |
| 2004/0198069 A1* | 10/2004 | Metzner | C23C 16/308 438/785 |
| 2005/0003396 A1 | 1/2005 | Ozkan et al. | |
| 2005/0017321 A1* | 1/2005 | Hakkarainen | H01L 27/0805 257/532 |
| 2006/0286774 A1 | 12/2006 | Singh et al. | |
| 2007/0037346 A1 | 2/2007 | Grant | |
| 2010/0041566 A1* | 2/2010 | Zhang | G01N 33/5005 506/9 |
| 2011/0039419 A1 | 2/2011 | Date et al. | |
| 2011/0156201 A1* | 6/2011 | Chen | H01L 27/24 257/522 |
| 2012/0138897 A1 | 6/2012 | Lin et al. | |
| 2014/0166617 A1 | 6/2014 | Chen et al. | |
| 2014/0248772 A1 | 9/2014 | Ma et al. | |
| 2015/0187598 A1* | 7/2015 | Campbell | H01L 27/0629 438/396 |
| 2015/0270140 A1* | 9/2015 | Gupta | H01L 21/32136 216/67 |
| 2015/0276651 A1* | 10/2015 | Petisce | C23F 1/44 204/403.1 |
| 2016/0181386 A1 | 6/2016 | Chi et al. | |
| 2017/0069469 A1* | 3/2017 | Goodyear | H01J 37/32174 |
| 2018/0269057 A1* | 9/2018 | Lei | C23C 16/45536 |
| 2019/0207075 A1* | 7/2019 | Megrant | H01F 6/04 |

FOREIGN PATENT DOCUMENTS

| | | |
|---|---|---|
| JP | H07-102973 B2 | 11/1995 |
| JP | 2001523390 A | 11/2001 |
| JP | 2007-537605 A | 12/2007 |
| JP | 2009514238 A | 4/2009 |
| JP | 2009536267 A | 10/2009 |
| WO | 9619829 A1 | 6/1996 |
| WO | 2005113855 A1 | 12/2005 |
| WO | 2007131040 A2 | 11/2007 |

OTHER PUBLICATIONS

Japanese Office Action dated May 11, 2021 for Application No. 2020-516831.
Chinese Office Action (with Eng. Translation) dated Jun. 23, 2021 for Application No. 201880062108.X.
Aimi, Marco F. et al., "High-aspect-ratio bulk micromachining of titanium", Nature Publishing Group 2004.
Jae Jeong Kim et al., "Optimized Surface Pre-treatments for Cu Electroless Plating in ULSI Device Interconnection", The Japan Society of Applied Physics 2001.
European Office Actiion dated Jun. 1, 2021 for Application No. 18861942.3.
European Search Report dated Oct. 6, 2021 for Application No. 18861942.3.
Korean Office Action dated Oct. 14, 2021 for Application No. 10-2020-7011639.
Chinese Office Action dated Jun. 1, 2022 for Application No. 201880062108.X.

* cited by examiner

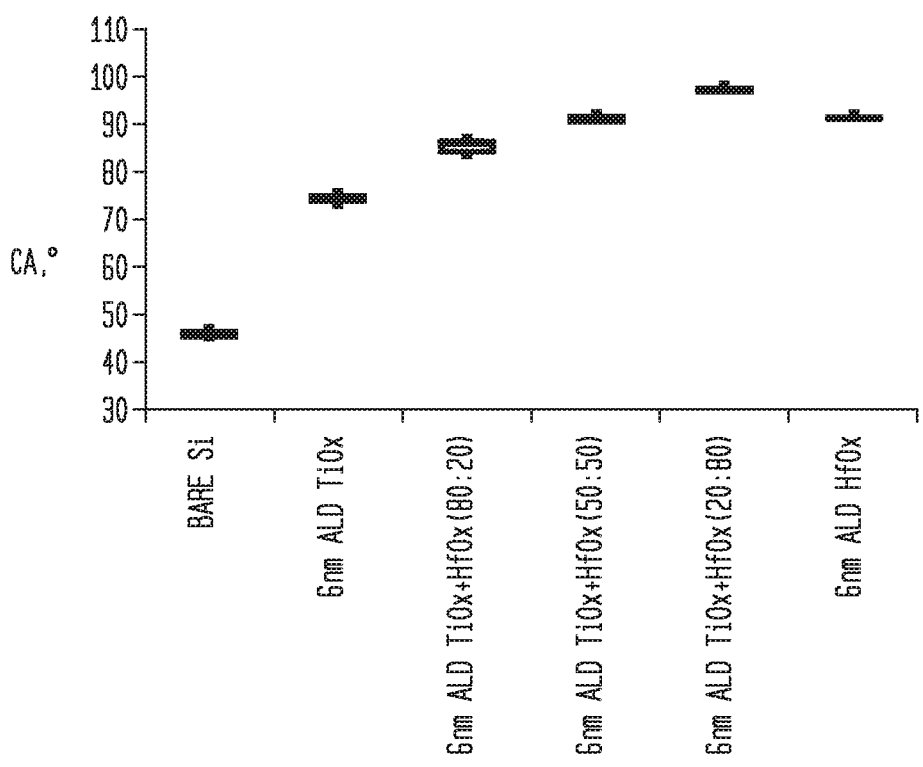

METHOD, MATERIALS AND PROCESS FOR NATIVE OXIDE REMOVAL AND REGROWTH OF DIELECTRIC OXIDES FOR BETTER BIOSENSOR PERFORMANCE

CROSS-REFERENCE TO RELATED APPLICATIONS

This application claims benefit of Indian Patent Application No. 201741034078, filed on Sep. 26, 2017, which is herein incorporated by reference in its entirety.

BACKGROUND

Field

Aspects disclosed herein relate to methods for forming improved substrates for biological or other life sciences applications.

Description of the Related Art

Titanium oxide (TiOx) is an example of a useful material for various physical and chemical functions, including for use as a gas, ion, or biological species-sensing material. Accordingly, TiOx is being used for various biometric sensing applications, such as in a phosphate sensor for DNA sequencing. Conventionally, porous TiOx films are formed on a substrate by anodization methods, such as anodic oxidation of a titanium (Ti) sheet in an aqueous solution containing hydrofluoric (HF) acid. A porous TiOx film may include a plurality of micro-electro-mechanical systems (MEMS) devices, which are sensitive to temperature, pH, and light.

Current MEMS devices generally include a sensor stack having a titanium surface on which an active dielectric sensing material is deposited. The dielectric layer serves as a gate oxide, which responds to changes in pH levels due to a phenomenon that causes surface hydroxyl (—OH) groups on the surface of the dielectric layer to react with an analytic material in an acidic or basic manner and produce a corresponding surface charge potential. The ability to detect changes in pH levels allows MEMS devices to be used for various sensing applications, including in DNA sequencing which, in one example, records DNA sequences by detecting discrete nucleotide incorporation events. However, the poor signal-to-noise ratio inherent in pH signals limits the throughput of the sensing substrate and negatively affects substrate performance.

Removal of a thin native oxide layer that forms on the surface of the titanium surface of the MEMS device before the dielectric layer is deposited generally improves the signal-to-noise ratio of the sensing substrate. Various methods for removing native oxides have been used, such as using wet etch chemistry and radical-based plasma cleaning. These methods, however, generally damage the other layers of the substrate, creating inconsistencies and impurities that also negatively affect substrate performance.

Additionally, background noise from the pH signals is caused by an excess in active sites for pH sensitivity. However, current methods for manufacturing pH sensors using titanium oxide (TiO) preclude the ability to effectively control of the number of active sites in active layers.

Therefore, there is a need for methods for removing native oxide layers and depositing dielectric materials having a controlled number of active sites for substrates.

SUMMARY

Methods of removing native oxide layers and depositing dielectric layers having a controlled number of active sites on MEMS devices for biological applications are disclosed. In one aspect, a method includes removing a native oxide layer from a surface of the substrate by exposing the substrate to one or more ligands in vapor phase to volatize the native oxide layer and then thermally desorbing or otherwise etching the volatized native oxide layer. In another aspect, a method includes depositing a dielectric layer selected to provide a controlled number of active sites on the surface of the substrate. In yet another aspect, a method includes both removing a native oxide layer from a surface of the substrate by exposing the substrate to one or more ligands and depositing a dielectric layer selected to provide a controlled number of active sites on the surface of the substrate.

In one aspect, a method for reducing native oxides is disclosed. The method includes positioning a substrate having an array of metal structures formed thereon in a process chamber, the metal structures having a native oxide layer formed thereon, exposing the native oxide layer to one or more ligands, and removing the native oxide layer.

In another aspect, a method for depositing a dielectric layer is disclosed. The method includes positioning a substrate having an array of metal structures formed thereon in a process chamber, introducing a first precursor into the process chamber, introducing a second precursor into the process chamber, performing a water pulse in the process chamber, and forming a dielectric layer over the array of metal structures.

In yet another aspect, a method for forming a substrate for biosensing is disclosed. The method includes positioning a substrate having an array of metal structures formed thereon in a process chamber, the metal structures having a native oxide layer formed thereon, exposing the native oxide layer to one or more ligands, removing the native oxide layer, introducing a first precursor into the process chamber, introducing a second precursor into the process chamber, performing a water pulse in the process chamber, and forming a dielectric layer over the array of metal structures.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, and may admit to other equally effective aspects.

FIG. 6C is a graph showing the contact angle of a dielectric layer at various compositions of the dielectric layer for deposition of 6 nm of dielectric material.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

Methods of removing native oxide layers and depositing dielectric layers having a controlled number of active sites on MEMS devices for biological applications are disclosed. In one aspect, a method includes removing a native oxide layer from a surface of the substrate by exposing the substrate to one or more ligands in vapor phase to volatize the native oxide layer and then thermally desorbing or otherwise etching the volatized native oxide layer. In another aspect, a method includes depositing a dielectric layer selected to provide a controlled number of active sites on the surface of the substrate. In yet another aspect, a method includes both removing a native oxide layer from a surface of the substrate by exposing the substrate to one or more ligands and depositing a dielectric layer selected to provide a controlled number of active sites on the surface of the substrate.

Methods described herein will refer to removal of a TiOx native oxide layer and/or deposition of a dielectric layer on a MEMS device, as an example. However, it is also contemplated that the described methods are useful to remove native oxides and deposit dielectric layers on any structures, such as other metal structures or carbon structures.

Figure 1:
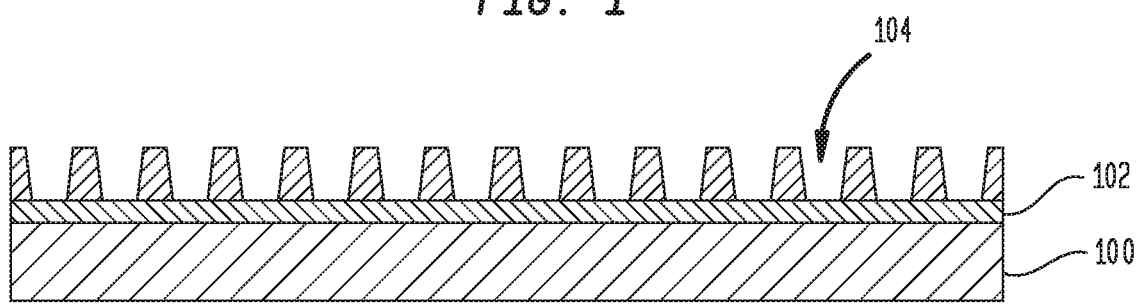
FIG. 1 is a perspective side view of a portion of a substrate having an array of titanium structures formed thereon.
Figure 2:
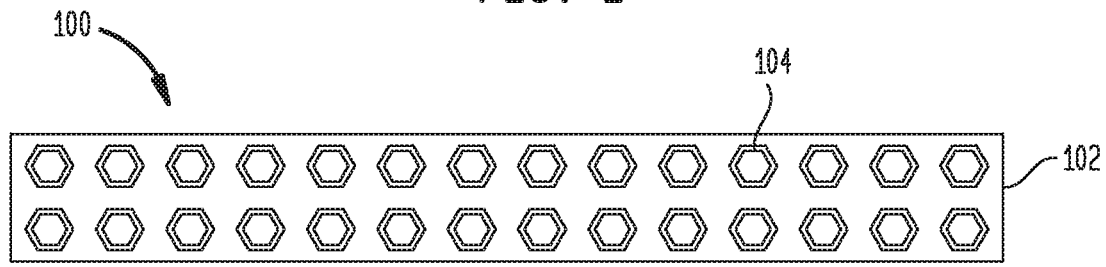
FIG. 2 is a top view of the array of titanium structures of FIG. 1.

FIG. 1 is a perspective side view of a portion of a substrate 100 having an array of titanium structures 104 formed thereon. FIG. 2 is a top view of the array of titanium structures 104 of FIG. 1. As shown in FIG. 1, a titanium layer 102 is disposed over the substrate 100. An array of titanium structures 104 is formed on the titanium layer 102. The titanium layer 102 provides a bottom surface of the titanium structures 104.

The substrate 100 is generally any substrate having a titanium or other metal layer thereon. A porous layer is generally any layer having natural pores therein. In one aspect, the substrate 100 has a porous titanium layer thereon. Some examples of porous titanium, which is useful for gas and biological-species sensing, include uniform pore structures such as nanotubes and microwells, bimodal pore structures, gradient pore structures, honeycomb structures, and closed-pore structures. As shown in FIG. 1, the titanium structures 104 are microwells.

In one aspect, each titanium structure 104 includes a MEMS device used for DNA sequencing when nucleotides are flowed sequentially over the substrate 100. In operation, protonation of the surface of the MEMS device provides a change in surface charge, which is detected as a change and voltage, which may correlate to a pH value for DNA sequencing purposes.

Figure 3:
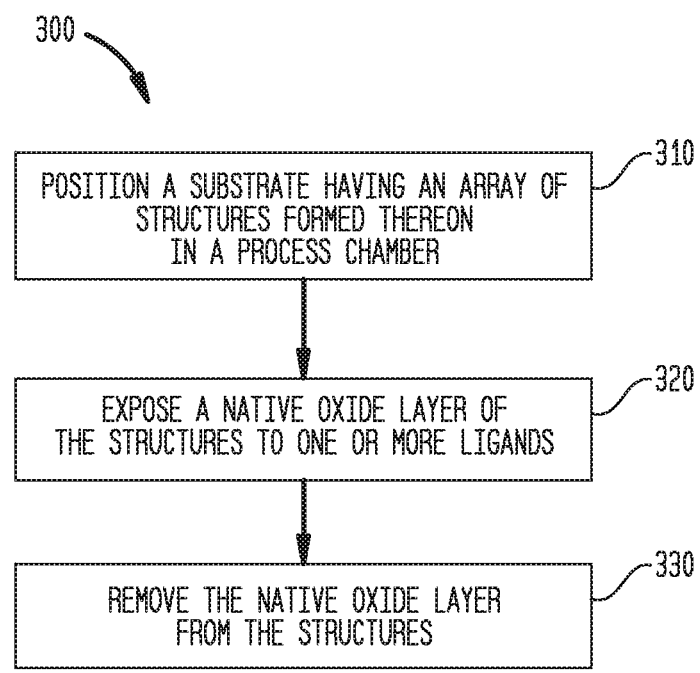
FIG. 3 is a process flow for removing a native oxide layer from a structure on a substrate.
Figure 4:
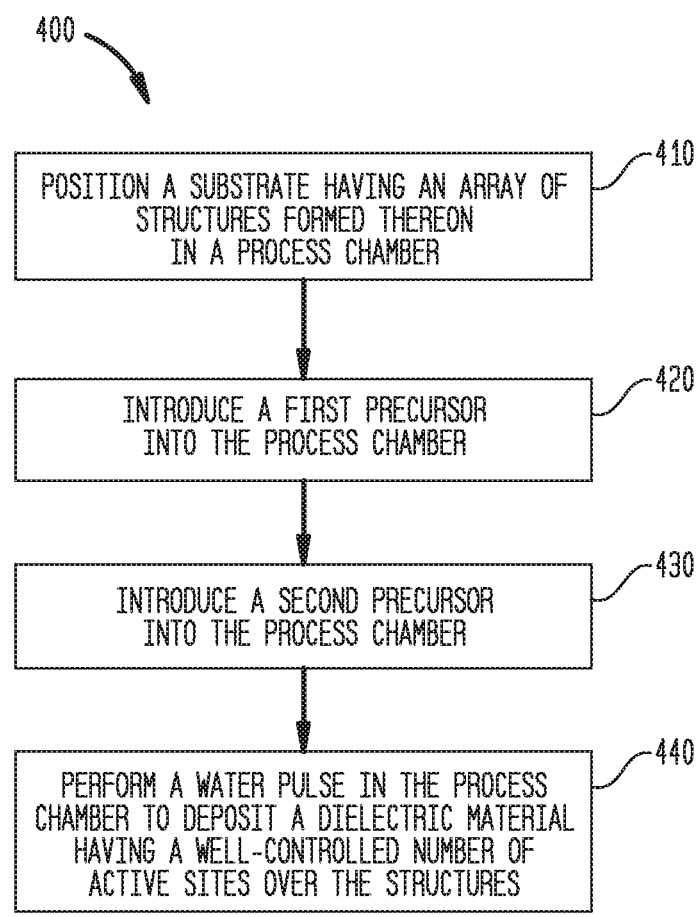
FIG. 4 is a process flow for depositing a dielectric layer over a substrate.
Figure 5A:
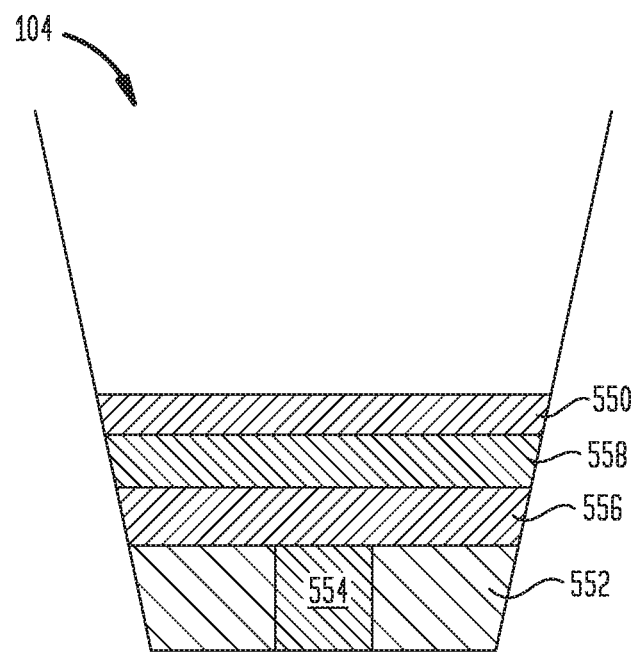
FIGS. 5A-5C depict cross-sectional views of a titanium structure formed according to process flows disclosed herein.
Figure 5B:
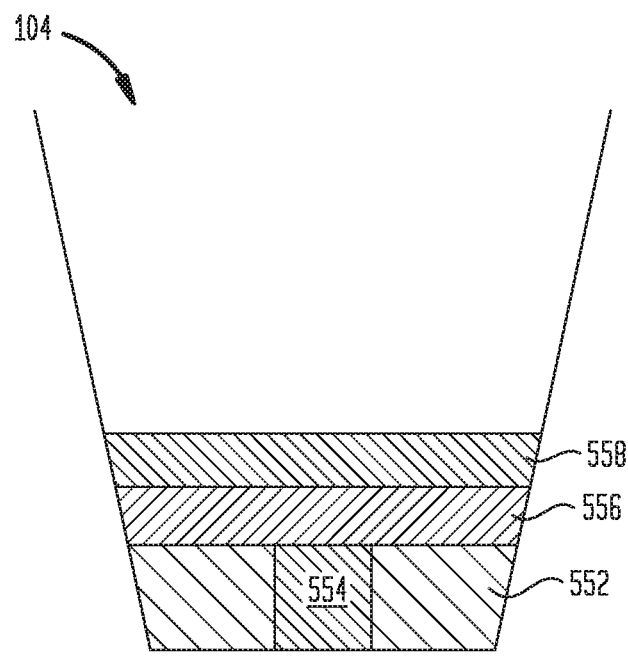
Figure 5C:
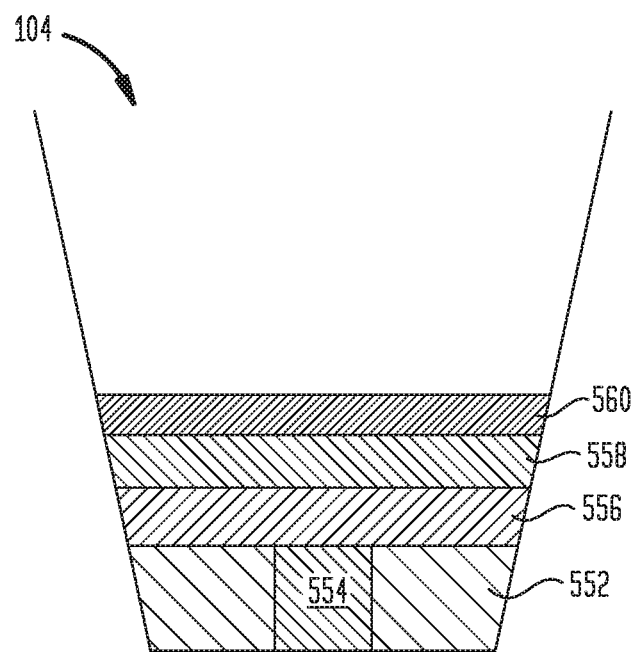

FIG. 3 is a process flow 300 for removing a native oxide layer from a structure on a substrate, such as a titanium layer or porous titanium layer. FIG. 4 is a process flow 400 for depositing a dielectric layer over a titanium layer of a substrate. FIGS. 5A-5C depict cross-sectional views of a titanium structure 104 formed according to process flows disclosed herein, such as at various operations of the process flow 300 and the process flow 400. The process flow 300 is useful for removal of a titanium oxide ($TiO_x$) layer from the titanium structures 104 formed on the substrate 100. The process flow 400 is useful for depositing a dielectric layer over the titanium structure 104 formed on the substrate 100.

Prior to process flow 300 and process flow 400, the substrate 100 having the array of titanium structures 104 formed thereon is generally formed by any suitable method. In one aspect, an array of titanium structures 104 is formed by depositing a titanium layer, such as titanium thin film, over the substrate 100 and anodizing the titanium layer in a hydrofluoric (HF) acid solution to form the titanium structures 104. As shown in FIG. 5A, the formed titanium structure 104 is a microwell, which includes a native oxide layer 550 on the surface thereof. In some aspects, the formed titanium structure 104 also includes various additional layers, including but not limited to, a complementary metal-oxide semiconductor (CMOS) stack 552 having a biometric sensor 554 therein, a titanium nitride (TiN) layer 556 and titanium (Ti) layer 558. As discussed above, the native oxide layer 550 negatively affects device uniformity and performance.

To facilitate understanding, the description of process flow 300 references FIG. 1 and FIGS. 5A-5B. The process flow 300 begins at operation 310 by positioning a substrate 100 having an array of titanium structures 104 formed thereon in a process chamber. The process chamber is generally any suitable deposition chamber. Examples of the process chamber include an atomic layer deposition (ALD) chamber or a chemical vapor deposition (CVD) chamber, such as those available from Applied Materials, Inc. of Santa Clara, Calif. It is contemplated, however, the other process chambers may be utilized.

At operation 320, the substrate 100 is exposed to one or more ligands. Without being bound by theory, the ligands bind to the native oxide, for example, $TiO_x$ or $TaO_x$, surface and makes a volatile complex which results in the loss or removal of native oxides, such as $TiO_x$ or $TaO_x$. In the aspect of FIGS. 5A-5B, the one or more ligands are generally in a vapor phase and react with the native oxide layer 550 to volatize the native oxide layer 550. The native oxide layer 550, after being volatized, is then generally removed from the substrate 100 at operation 330. For example, the volatized native oxide layer 550 may be etched from the surface or removed by desorption upon heating. In one aspect, the substrate temperature during the process is varied from between about 150 degrees Celsius (° C.) and about 350° C. The process pressure with the delivery of the one or more ligands is varied from between about 200 mTorr and about 50 Torr, for example between about 200 mTorr and about 20 Torr, or about 100 mTorr and about 10 Torr, or between about 50 mTorr and about 5 Torr, or between about 25 mTorr and about 3 Torr.

Generally, a submonolayer to a monolayer of the volatized native oxide layer 550 is removed at a time, e.g., per cycle. Thus, exposing the substrate 100 to one or more ligands is generally continuously or cyclically repeated any suitable number of times needed to completely remove the native oxide layer 550, as shown in FIG. 5B.

The one or more ligands generally include any primary, secondary, or tertiary amine. Examples of suitable ligands include, but are not limited to, TEMPO (2,2,6,6-tetramethylPiperidin-1-yl)oxidanyl, tert-butyl peroxybenzoate, hydroxylamine (50% in water), ammonia (0.5M) in oxolane (THF), methylamine (2M in THF), 2-fluoroaniline, 2-fluoro-6-(trifluoromethyl)aniline, 2-fluoro-3-(trifluoromethyl)aniline, trimethyl(trifluoromethyl)silane, methylamine solution (40% in water), ethylamine solution, diethylamine, ethanolamine, N-ethylmethylamine, ethylenediamine, 2-dimethylaminoethanol, propylamine, dipropylamine, dimethylamine solution (40%), and mixtures thereof. A substrate may be exposed to one or more the ligands cyclically or sequentially.

In one aspect, a temperature in the process chamber during the exposure to one or more ligands is between about 150° C. and about 300° C., such as between about 200° C. and about 300° C. A flow rate of the one or more ligands into the process chamber is between about 5 standard cubic centimeters per minute (sccm) and about 500 sccm or about or about 5 sccm to 200 sccm or about 5 sccm to 100 sccm or about 5 sccm to 50 sccm or about 5 sccm to 25 sccm. A pressure inside the process chamber is between about 200 mTorr and about 50 Torr, for example between about 200 mTorr and about 20 Torr, or about 100 mTorr and about 10 Torr, or between about 50 mTorr and about 5 Torr, or between about 25 mTorr and about 3 Torr.

As discussed above, the native oxide layer 550 is a $TiO_x$ layer. However, described in-situ vapor phase cleaning processes using atomic layer etching processes with ligand chemistry are also useful to remove other native metal oxide layers, such as tantalum oxides ($TaO_x$).

The present disclosure also contemplates alternative operations for reducing or removing the native oxide layer 550, such as by plasma treatment and hydrogen exposure. For example, the substrate 100 may be exposed to a plasma treatment process to weaken the bonds in the native oxide layer 550, such as titanium-oxygen (Ti—O) bonds in a $TiO_x$ layer, to form a plasma-treated oxide layer. In one aspect, weakening the bonds includes physically damaging the native oxide layer 550 such that a lower-energy, for example 1-3 electron volts (eV), is required for subsequent breaking the bonds during subsequent exposure to hydrogen radicals. The plasma treatment physically damages or otherwise weakens the Ti—O bonds of the native oxide layer 550 so that the plasma-treated oxide layer is prepared for subsequent reduction and removal.

The substrate 100 may then be exposed to, or bombarded with, hydrogen radicals to remove the plasma-treated oxide layer. Since the plasma-treated oxide layer has already been plasma-treated to weaken the Ti—O bonds of the layer, a low-energy hydrogen exposure can be used to remove the plasma-treated oxide layer by reacting the hydrogen radicals with the weakly bonded Ti—O molecules. More specifically, the hydrogen radicals react with the oxide in the plasma-treated oxide layer and cause an oxide reduction and formation of products, such as water ($H_2O$) and titanium hydrides. Using low-energy hydrogen selectively removes the plasma-treated oxide layer and thus reduces the potential for damage to the other layers on the substrate 100. The plasma treatment and exposure to hydrogen radicals is repeatable any number of times until the native oxide layer 550 is reduced or removed.

In one aspect, plasma treating the substrate 100 includes a low energy plasma treatment at a plasma power of 13.56 Megahertz (MHz). The plasma precursor is generally an unreactive gas, including but not limited to an inert gas, such as argon (Ar) and/or helium (He). The flow rate of the plasma precursor is between about 10 standard cubic centimeters per minute (sccm) and about 50 sccm. The radio frequency (RF) power is between about 200 watts (W) and about 700 W. The process chamber pressure is between about 5 millitorr (mTorr) and about 60 mTorr. The substrate 100 is generally at a low temperature, for example, about room temperature (e.g., between about 20 degrees Celsius (° C.) and about 25° C.).

In one aspect, exposing the substrate 100 to hydrogen radicals to remove the plasma-treated oxide layer includes a hot wire chemical vapor deposition (HWCVD) process. The HWCVD process generally includes providing hydrogen ($H_2$) gas into a process chamber, such as an HWCVD chamber, at any suitable flow rate, heating one or more filaments disposed in the process chamber to a temperature sufficient to dissociate the $H_2$ gas and provide at least a portion of the energy for facilitating subsequent removal of at least a portion of the plasma-treated oxide layer, and exposing the substrate 100 to the dissociated $H_2$ gas to remove at least some of the plasma-treated oxide layer. The one or more filaments are generally heated to a temperature between about 1,200° C. and about 1,700° C. The temperature of a substrate heater is generally low, for example, between about 200° C. and about 400° C. The flow rate of the $H_2$ gas is generally between about 100 sccm and about 500 sccm, for example, about 400 sccm. The process chamber pressure is generally between about 0.1 torr (T) and about 1.0 T, for example, about 0.5 T. The duration of the HWCVD process is generally between about 50 seconds and about 4 hours, for example between about 100 seconds and about 200 seconds, such as about 120 seconds. In another aspect, exposing the substrate 100 to hydrogen radicals to remove the plasma-treated oxide layer includes introducing hydrogen radicals to a process chamber from a remote microwave or radiofrequency (RF) plasma source (RPS).

After reduction or removal of the native oxide layer, an initial protection layer may be deposited to protect against formation of unwanted low quality native oxide. In one aspect, the initial protection layer is a high quality dielectric such as ALD $TiO_2$ or TiN.

FIG. 4 is a process flow 400 for depositing a dielectric layer over a substrate. Generally, the process flow 400 provides a method for atomic layer depositing a dielectric layer 560 having a controlled number of active sites, such as hydroxyl (—OH) groups, over the substrate 100, such as on the titanium layer 558, as shown in FIG. 5C. The process flow 400 may be performed alone, or in combination with the process flow 300, for example, after operation 330.

To facilitate understanding, the description of process flow 300 references FIG. 1 and FIG. 5C. Process flow 400 begins at operation 410 by positioning a substrate having an array of structures formed thereon in a process chamber. In one aspect, a substrate, such as the substrate 100 having titanium structures 104 thereon is positioned or remains in the same process chamber as the process chamber used for process flow 300. In another aspect, the substrate, such as the substrate 100 having titanium structures 104 thereon, is positioned in a second process chamber. The process chamber of process flow 400 is generally an ALD chamber, such as those available from Applied Materials, Inc. of Santa Clara, Calif. It is contemplated, however, the other process chambers may be utilized.

At operation 420, a first precursor is introduced into the process chamber. At operation 430, a second precursor is introduced into the process chamber. At operation 440, a water pulse is performed in the process chamber to form a dielectric layer 560 over the titanium layer 558, as shown in FIG. 5C. The process chamber is optionally purged with an inert gas, such as helium (He), argon (Ar), neon (Ne), krypton (Kr), xenon (Xe), and/or radon (Rn), or the like, between operation 420 and operation 430, as well as between operation 430 and operation 440. Operation 420, operation 430, and operation 440 generally deposit a sub-monolayer to a monolayer, for example between about 0.3 Angstroms and about 0.6 Angstroms, of dielectric layer 560 per each cycle. Thus, operation 420, operation 430, and operation 440 are generally repeated any suitable number of times until the dielectric layer 560 has been deposited to a desired thickness, for example between about 2 nanometers (nm) and about 10 nm. The desired thickness may be, for example, 2 nm, 4 nm, or 6 nm.

In one aspect, since native oxides may have been previously removed, for example, by the process flow 300 described above, a plurality of active sites are provided on the substrate, for example through exposure to water, prior to contacting the substrate with the first precursor, in order to facilitate adhesion of the first precursor.

In one aspect, at operation 420, the first precursor is generally pulsed into the process chamber and then the second precursor is generally pulsed into the process chamber at operation 430. The process temperature is generally varied between 150° C. and about 250° C. The pulse times generally vary from between about 50 msec and about 0.25 sec. The process pressure is generally any suitable pressure for the process chamber. In one aspect, the pressure is between about 30 mTorr and about 100 mTorr. In another aspect, the pressure is between about 40 mTorr and about 200 mTorr.

In another aspect, the first precursor is pulsed into the process chamber followed by a water pulse, in a first operation. In a second operation, one pulse of the first precursor is introduced, followed by or concurrently introduced with a pulse of the second precursor. After the second operation, a nitrogen gas $N_2$ purge is performed, and then a water pulse is performed. Thus, in this aspect, dielectric layers of $TiSiO_x$ or $HfSiO_x$ or $HfZrSiO_x$ films are deposited, rather than the surface being terminated with either $SiO_x$ or $TiO_x$ for $TiSiO_x$ or $HfO_x$ or $SiO_x$ (for $HfSiO_x$) $ZrO_x$ or $SiO_x$ for ($ZrSiO_x$), as is the case in conventional methods.

The first precursor and the second precursor are selected to form a dielectric layer 560, which serves as the active layer, having a surface potential of between about 50 milivolts (mV) dec-1 and about 70 mV dec-1, which is increased from the 25 mV dec-1 to 55 mV dec-1 surface potential of conventionally-deposited dielectric layers and thus provides increased sensing capability for the substrate. The dielectric layer 560 is generally any suitable dielectric material including a high concentration dielectric material, a low concentration dielectric material, or mixtures thereof. Examples of suitable dielectric layers include, but are not limited to, $Ta_2O_5$, $HfSiO_x$, $TiSiO_x$, and/or $ZrSiO_x$.

The concentration of the first precursor and the concentration of the second precursor are generally selected to improve substrate performance for various processes.

In the example of substrate 100 having titanium structures 104 formed thereon, the titanium layer 558 generally includes a plurality of hydroxyl groups on the surface thereof. Without being bound by theory, the hydroxyl groups are generally formed by exposing the titanium layer 558, which is highly hydrophilic, to water or $O_2$ molecules. Referring back to FIG. 4, the first precursor reacts with a first portion of the hydroxyl groups on the titanium layer 558 during operation 420, and the second precursor reacts with a second portion of the hydroxyl groups during operation 430. It is contemplated that increasing exposure time of the first precursor or second precursor, or pressure within the process chamber affects the growth rate and relative proportion of the first precursor and the second precursor in the deposited dielectric layer. In one aspect, exposure time or pressure is adjusted to occupy a pre-determined number of active sites. Accordingly, the first precursor and the second precursor are useful to control the number of hydroxyl groups, which serve as active sites, and increase or decrease the hydrophobicity of the dielectric layer to improve the functionality of the substrate.

The first precursor is generally any silicon-containing, titanium-containing, tantalum-containing, or other metal-containing precursor. Examples of suitable titanium precursors include, but are not limited to, tetrakis(dimethylamido) titanium, titanium(IV)isopropoxide, titanium(IV)butoxide and titanium(IV)ethoxide. An example of a suitable silicon precursor includes, but is not limited to, tetraethylortho silicate (TEOS) silanol. Examples of suitable tantalum precursors include, but are not limited to, tantalum(V)ethoxide, tetrakis(dimethylamido)tantalum(V) ($Ta(NMe_2)_5$), tris(diethylamido)(ethylimido)tantalum(V) ($Ta(NEt)(NEt_2)_3$), $TaCl_5$, $TaI_5$, and $TaF_5$.

The second precursor is generally any suitable hafnium-containing precursor. Examples of suitable hafnium precursors include, but are not limited to, tetrakis(dimethylamino) hafnium, tetrakis(ethylmethylamino) hafnium, hafnium chloride, and hafnium iodide.

Depending on the first precursor and the second precursor used in the methods disclosed herein, the dielectric layer, which serves as the sensing layer, generally includes, but is not limited to, one or more of $TiSiO_x$ or $HfSiO_x$ or $HfZrSiO_x$.

While the forgoing aspects contemplate using thermal ALD to deposit the dielectric layer, the present disclosure also contemplates using plasma enhanced ALD (PEALD) to deposit the dielectric layer 560. PEALD provides deposition of good quality films and also provides for reduced substrate temperature or other process temperatures. In one aspect, the PEALD deposition of the dielectric material utilizes an oxygen plasma. In another aspect, the PEALD deposition of the dielectric material utilizes a mixture of oxygen and nitrogen plasma. In another aspect, the PEALD deposition of the dielectric material utilizes a mixture of oxygen and argon plasma.

Methods disclosed herein generally provide metal structures without native oxides and having improved dielectric layers deposited thereon. By removing the native oxide layer from the surface of the metal structures, such as $TiO_x$ from titanium structures, the signal-to-noise ratio of the substrate is decreased. By introducing first and second precursors selected to increase or decrease the hydrophobicity of the metal or silicon layer, the number of active sites on the surface thereof is controlled according to the requirements of the subsequent functions to be performed by the substrate. For example, MEMS devices formed according to methods disclosed herein exhibit better sensing capabilities for bio-sensing applications, such as DNA sequencing, because the signal-to-noise ratio has been reduced and the number of active sites of the dielectric layer is controlled for optimal DNA sequencing by detecting pH signals.

Additionally, the disclosed methods provide for substantially uniform deposition thickness across the substrate 100, independent of precursor composition, as shown in Table 1. Moreover, a uniform consistency in the composition of the dielectric layer across the surface of the substrate is also achievable, as shown in Table 2.

TABLE 1

| Target thickness | 2 nm | 4 nm | 6 nm |
|---|---|---|---|
| TiOx | 2.4 nm | 4.2 nm | 6.2 nm |
| HfOx | 2.2 nm | 4.4 nm | 5.7 nm |
| HfTiOx(80% TiOx + 20% HfOx) | 2.8 nm | 4.7 nm | 6.5 nm |
| HfTiOx(50 TiOx + 50 HfOx) | 2.1 nm | 3.8 nm | 5.1 nm |
| HfTiOx(20% TiOx + 80% HfOx) | 1.9 nm | 3.5 nm | 5.0 nm |

TABLE 2

| | % Atomic Concentration | | |
|---|---|---|---|
| Site | Hf (Peak I.D. = 4f) | Ti (Peak I.D. = 2p) | O (Peak I.D. = 1s) |
| S1_1 | 5.79 | 22.42 | 71.79 |
| S1_2 | 5.74 | 22.23 | 72.03 |
| S1_3 | 5.60 | 22.10 | 72.30 |

Figure 6A:
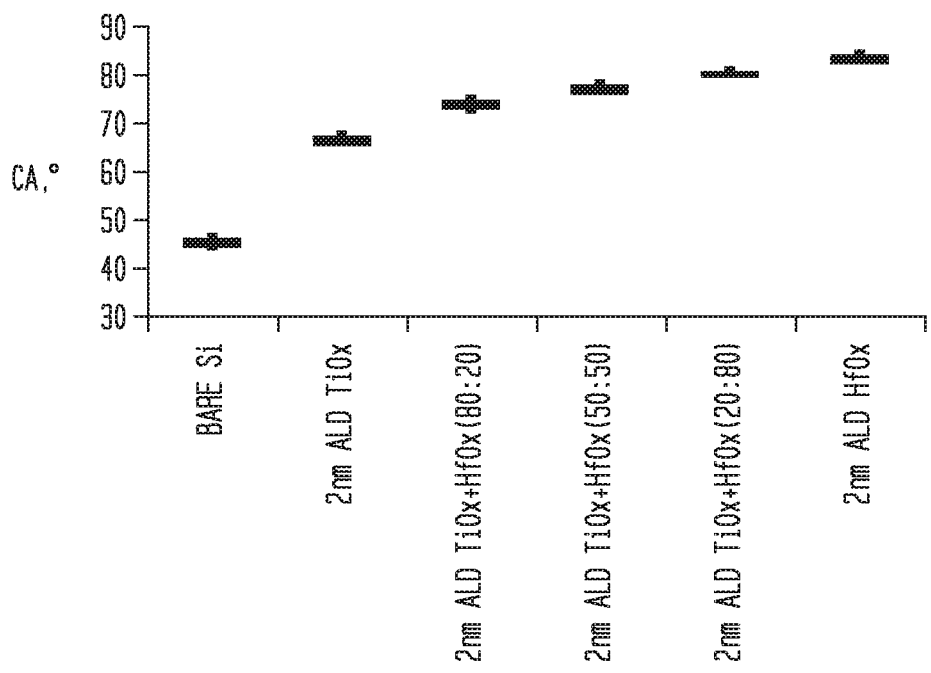
FIG. 6A is a graph showing the contact angle of a dielectric layer at various compositions of the dielectric layer for deposition of 2 nm of dielectric material.
Figure 6B:
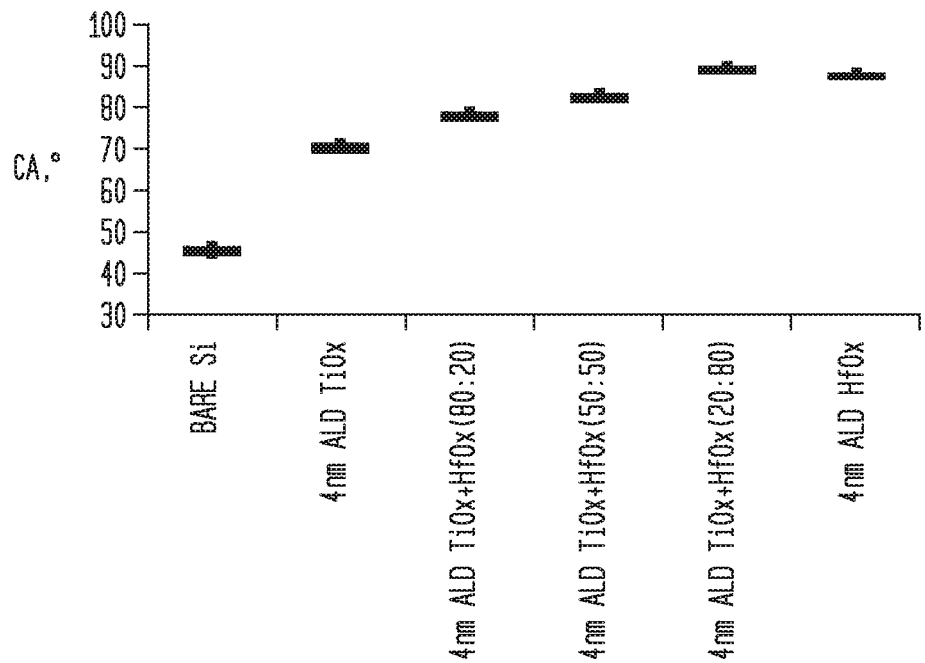
FIG. 6B is a graph showing the contact angle of a dielectric layer at various compositions of the dielectric layer for deposition of 4 nm of dielectric material.

FIGS. 6A-6C depict graphs showing the contact angle of the dielectric layer at various compositions of the dielectric layer for deposition of 2 nm of dielectric material, 4 nm of dielectric material, and 6 nm of dielectric material, respectively. The contact angle is indicative of the wettability of a solid surface by a liquid. Controlling the wettability of the surface provides for better control of the substrate performance. For example, control of the wettability of the surface of a biosensor substrate improves the biological interaction between the surface and the surrounding medium. As shown in FIGS. 6A-6C, the hydrophobicity of the dielectric layer generally increases as the proportion or concentration of hafnium in the dielectric layer increases.

Aspects disclosed herein may further include additional processes such as radical treatment and/or high temperature annealing, for example at a temperature between about 300° C. and about 500° C., and for a duration between about 30 minutes and about 4 hours, to further reduce defects and improve crystallinity.

While the foregoing is directed to aspects of the present disclosure, other and further aspects of the disclosure may be devised without departing from the basic scope thereof, and the scope thereof is determined by the claims that follow.

What is claimed is:

1. A method for reducing native oxides, comprising:
positioning a MEMS device for biological applications having an array of metal structures formed thereon in a process chamber, the array of metal structures having a native oxide layer formed thereon;
exposing the native oxide layer to one or more ligands to volatize the native oxide layer, the one or more ligands being selected from the group consisting of primary amines, secondary amines, and tertiary amines; and
removing the volatized native oxide layer by etching or desorption during a heating process to reduce a signal-to-noise ratio of the MEMS device for biological applications.

2. The method of claim 1, wherein the array of metal structures comprise titanium structures, wherein one or more of the titanium structures comprises a biometric sensor disposed therein.

3. The method of claim 1, wherein each of the one or more ligands is selected from the group consisting of diethylamine, propylamine, and dipropylamine.

4. The method of claim 1, wherein a temperature of the process chamber is between about 150 degrees Celsius and about 300 degrees Celsius.

5. A method for depositing dielectric material, comprising:
positioning a MEMS device for biological applications having an array of metal structures formed thereon in a process chamber;
introducing a first precursor into the process chamber;
introducing a second precursor into the process chamber;
performing a water pulse in the process chamber; and
forming a dielectric layer over the array of metal structures, the dielectric layer having a surface potential of between about 50 mV dec-1 and about 70 mV dec-1 and a controlled number of active sites, wherein the controlled number of active sites comprises hydroxyl groups.

6. The method of claim 5, wherein the first precursor is a titanium-containing, tantalum-containing, or silicon-containing precursor.

7. The method of claim 6, wherein the second precursor is a hafnium-containing precursor.

8. The method of claim 5, further comprising purging the process chamber with an inert gas before introducing the second precursor.

9. The method of claim 8, wherein the inert gas is selected from the group consisting of helium, argon, neon, krypton, xenon, and/or radon (Rn).

10. The method of claim 5, further comprising purging the process chamber with an inert gas before performing the water pulse in the process chamber.

11. The method of claim 5, wherein the dielectric layer has a thickness of between about 2 nanometers and about 10 nanometers.

12. A method for forming a substrate for biosensing, comprising;
positioning a MEMS device for biological applications having an array of metal structures formed thereon in a process chamber, the array of metal structures having a native oxide layer formed thereon;
exposing the native oxide layer to one or more ligands to volatize the native oxide layer, the one or more ligands being selected from the group consisting of primary amines, secondary amines, and tertiary amines;
removing the volatized native oxide layer by etching or desorption during a heating process to reduce a signal-to-noise ratio of the MEMS device for biological applications;
introducing a first precursor into the process chamber;
introducing a second precursor into the process chamber;
performing a water pulse in the process chamber; and
forming a dielectric layer over the array of metal structures, the dielectric layer having a surface potential of between about 50 mV dec-1 and about 70 mV dec-1 and a controlled number of active sites.

13. The method of claim 12, wherein the forming the dielectric layer over the array of metal structures comprises performing a plasma enhanced atomic layer deposition.

14. The method of claim 13, wherein the first precursor or the second precursor is selected from the group consisting of oxygen, a mixture of oxygen and nitrogen, and a mixture of oxygen and argon.

15. The method of claim 12, further comprising:
depositing a protection layer over the dielectric layer.

16. The method of claim 12, further comprising:
annealing the MEMS device for biological applications at a temperature between about 300 degrees Celsius and about 500 degrees Celsius for a duration between about 30 minutes and about 4 hours.

* * * * *